LAYERED CIRCUIT HOLDER AND RECEPTACLE

Filed Dec. 26, 1961 3 Sheets-Sheet 1

INVENTOR
LEO L. BOCK
THEODORE E. CENS
MICHAEL S. SHEBANOW
BY Herbert F. Sonnemeyer
ATTORNEY

LAYERED CIRCUIT HOLDER AND RECEPTACLE

Filed Dec. 26, 1961 3 Sheets-Sheet 2

INVENTORS
LEO L. BOCK
THEODORE E. CENS
MICHAEL S. SHEBANOW
BY Herbert F. Sonnemeyer
ATTORNEY

LAYERED CIRCUIT HOLDER AND RECEPTACLE

Filed Dec. 26, 1961 3 Sheets-Sheet 3

INVENTORS
LEO L. BOCK
THEODORE E. CENS
MICHAEL S. SHEBANOW
BY Herbert F. Somermeyer
ATTORNEY United States Patent Office 3,193,791

Patented July 6, 1965

3,193,791

LAYERED CIRCUIT HOLDER AND RECEPTACLE

Leo L. Bock, Roseville, Minn., Theodore E. Cens, Westport, Conn., and Michael S. Shebanow, Pelham Manor, N.Y., assignors to Sperry Rand Corporation, New York, N.Y., a corporation of Delaware Filed Dec. 26, 1961, Ser. No. 162,004
18 Claims. (Cl. 339—176)

This invention relates to electrical receptacles having contact members adapted to electrically engage spaced terminal portions of circuitry disposed along the edge of a printed circuit card.

In the recent past the use of printed electrical circuits has increased extensively because of their unique packaging capabilities, reliability, reproducibility and reasonable cost. Printed circuits require means suitable for electrically connecting and supporting the printed circuitry with other circuit types and apparatus. This is generally accomplished by arranging the terminal portions of conductive strips disposed on the printed circuit card in spaced-apart relationship along one edge of the printed circuit card. The card is inserted edgewise into a receptacle consisting of a plurality of individual resilient metallic contacts supported by an insulating housing. A first portion of each metallic contact is adapted to slidably engage the printed circuit terminals, and a second portion of each contact is adapted to be electrically attached to individual wires or circuit elements.

Several factors must be considered in the fabrication of an electrical connecting means suitable for use with printed circuits. Modern complex electronic equipment requires unitized construction permitting easy assembly and maintenance. Additionally, modern manufacturing schemes stress automation to effect reduced cost and increased reliability. It is therefore desirable to provide a printed circuit connecting means possessing a unitized construction and adapted for automatic wiring processes.

Automatic wiring is accomplished through the use of the so-called wire-wrap machines now commercially available. The wire-wrap machines are programmed to automatically interwire a plurality of printed circuit receptacles. To do this, the wire-wrap terminals extending from a receptacle have to be spaced apart some minimum distance to accommodate the wire wrapping heads. Several factors or parameters must be considered in the construction of a printed circuit receptacle, but at least one, the size of the wire-wrapping head on the wire-wrap machine, determines the minimum spacing of contact terminals suitable for wire-wrapping.

Because of the spacing requirements of terminals adapted for automatic wire-wrapping processes, the receptacle using such terminals requires a substantial connecting area. It will be appreciated that wire-wrap terminal space requirements necessarily affect the special arrangement of the contacts, and the number of contacts which can be employed in a given space is limited. This restriction is a limiting factor with respect to circuit design, oftentimes limiting the amount and types of circuit which may be disposed on a single printed circuit card. Such a limitation increases the number of printed circuit cards necessary for a given circuit assembly with a corresponding increase in backboard or card interconnecting wiring. Thus, the size of an electronic device, for example, a computer utilizing wire-wrapping techniques, is increased, with corresponding increased lengths of wire which can limit the operational speed of the computer.

This invention provides a printed circuit card receptacle which permits automatic wiring and wherein the contact density is good.

It is therefore an object of this invention to provide a printed circuit receptacle adapted for automatic wiring processes and having a contact density which minimizes the number of printed circuit cards employed and the lengths of wires used to interconnect various receptacles.

It is another object of this invention to provide terminal tie-points on a receptacle for interconnecting printed circuit card receptacles independently of printed circuit card engaging contact members.

It is still another object of this invention to provide a card guide apparatus for releasably locking and guiding a printed circuit card in a receptacle.

One embodiment of the present invention wherein the aforementioned objects are accomplished includes an elongated insulating housing having an opening defined by spaced longitudinal side walls joined by end walls and a bottom wall, the bottom wall having a plurality of apertures therein. Arranged within the opening are two substantially parallel rows of an unequal number of spaced contact members, the members of one row being disposed in faced relationship to certain of the members of the other row. Each contact member comprises a resilient portion, an offset portion, and a terminal portion, the terminal portions extending through one of the apertures and being disposed outside the housing and arranged in three rows substantially parallel with the side walls. The terminal portions in the two outer rows are alternately spaced in the longitudinal direction and are adapted for accommodating automatic wire wrapping machines. The terminal portions in the central row are laterally aligned with the terminal portions of one outside row, the terminal portions of the central row being, in a preferred embodiment, approximately one-third the length of the terminals in the outer rows. Conventional techniques such as soldering, may be used for connecting wires to the center row of terminals. The resilient portions of the contact members are designed to resiliently engage spaced circuit terminal tabs disposed on a printed circuit card, the card being inserted between the rows of contact members. The offset portions of the contact members extend parallel to the end walls and along the bottom wall to their associated terminal portions extending through their respective apertures.

The terminal portions of the contact members are located at the intersections of lines forming a one-eighth inch grid, the center and one of the outer rows of terminals being aligned in a plane perpendicular to the direction of the rows. In the second of the outer terminal rows, the terminals are offset or staggered so as to be located substantially midway between the terminals of the other rows, but transversely spaced from the center row.

This particular grid arrangement of contact terminal portions, in the light of the many parameters involved, results in an extremely dense terminal configuration suitable for accommodating both manual and automatic wiring equipment, and is effective to significantly increase the contact member density, allowing the use of terminal tabs disposed on opposite sides of a printed circuit card. The disposition of circuitry on both sides of a single card results in a reduction of the number of cards used and also in backboard wiring.

The aforementioned embodiment is adapted to be incorporated into a receptacle assembly capable of receiving a plurality of printed circuit cards. The terminal arrangement mentioned above is retained throughout the assembly so that wire-wrap terminals are appropriately spaced as required by the automatic wire wrapping machines.

These and other more detailed and specific objects will be disclosed in the course of the following specification, reference being had to the accompanying drawings, in which:

FIG. 1 is a perspective view of a receptacle with a portion of the housing broken away and illustrative of one embodiment of this invention;

FIG. 1*a* is a partial top plan view of FIG. 1;

Figures 1A, 6, 6A:
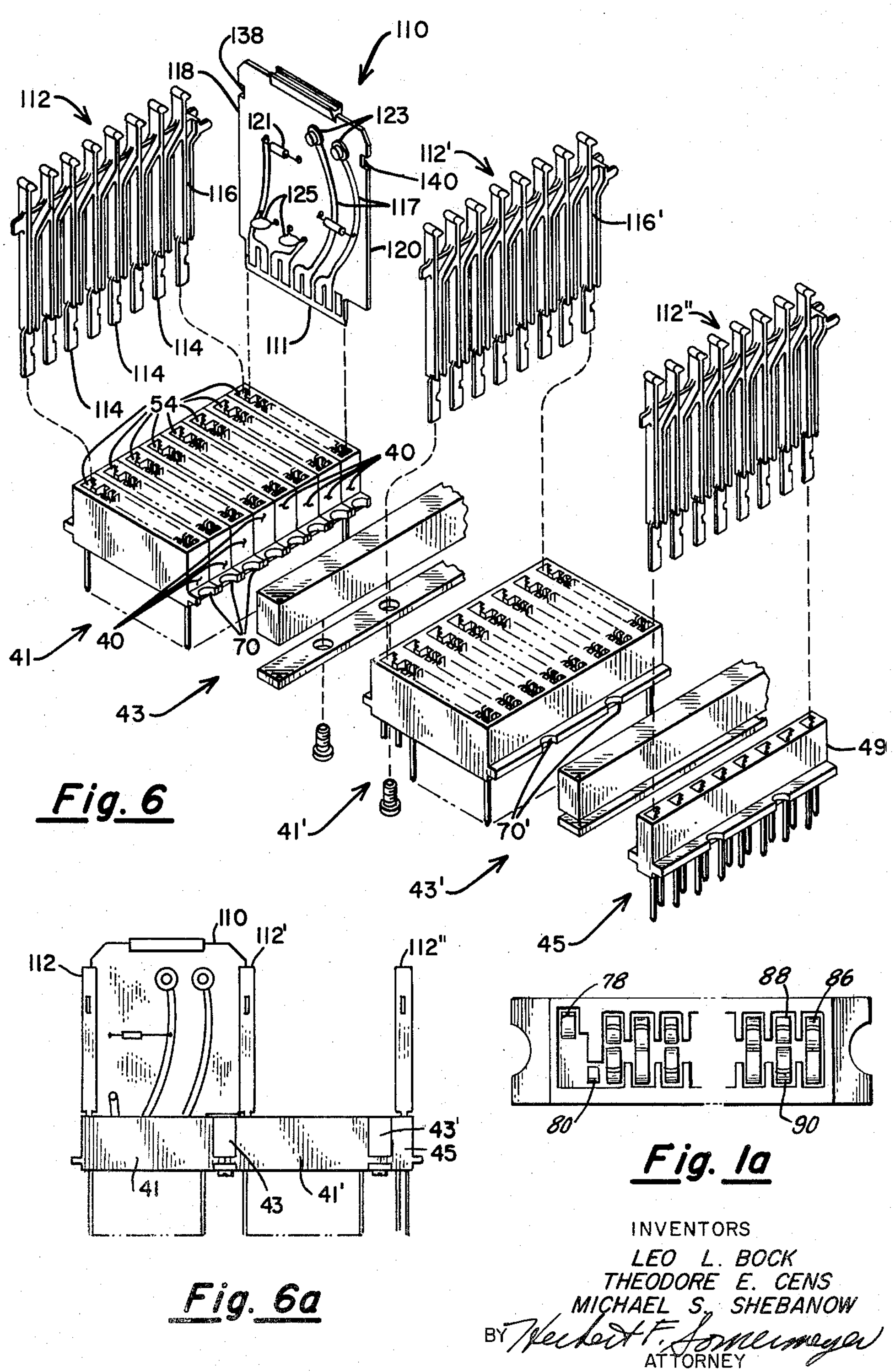
FIG. 6 is a perspective view of a group of the receptacles illustrated in FIG. 1 and also depicting a cooperating printed circuit card and card guide apparatus.
Figure 7:
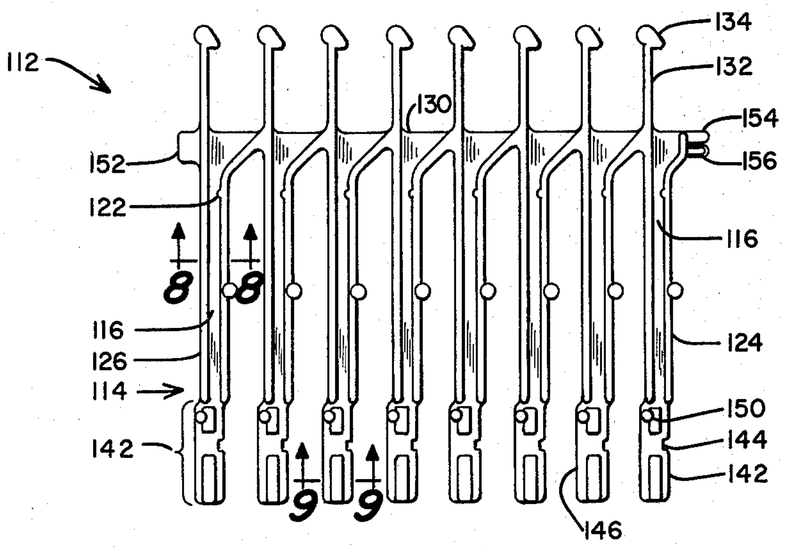
Figure 8:
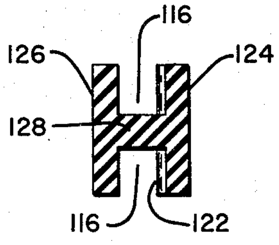
Figure 10:
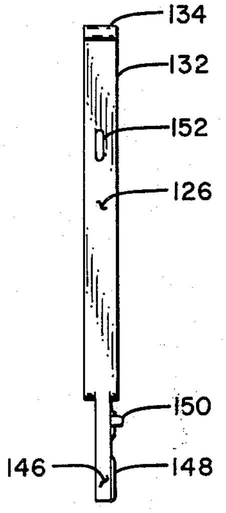
Figure 9:
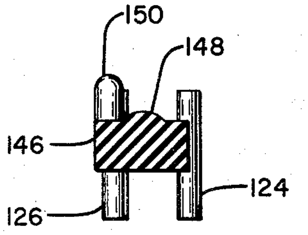

FIG. 6*a* is a front assembled view of the FIG. 6 apparatus on a slightly reduced scale;

FIG. 7 is a side elevational view of a portion of the card guide apparatus illustrated in FIG. 6;

FIG. 8 is an enlarged sectional view taken substantially along the line 8—8 of FIG. 7;

FIG. 9 is an enlarged sectional view taken substantially along the line 9—9 of FIG. 7;

FIG. 10 is a front elevational view of the card guide apparatus of FIG. 7; and

Figure 11:
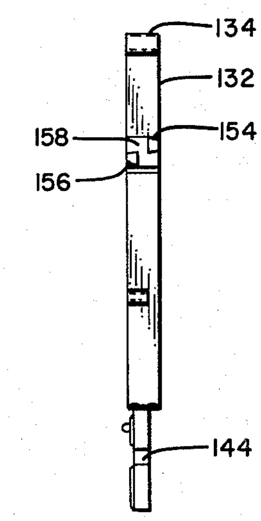

FIG. 11 is a rear elevational view of the card guide apparatus of FIG. 7.

Figures 1, 2, 3, 4, 5:
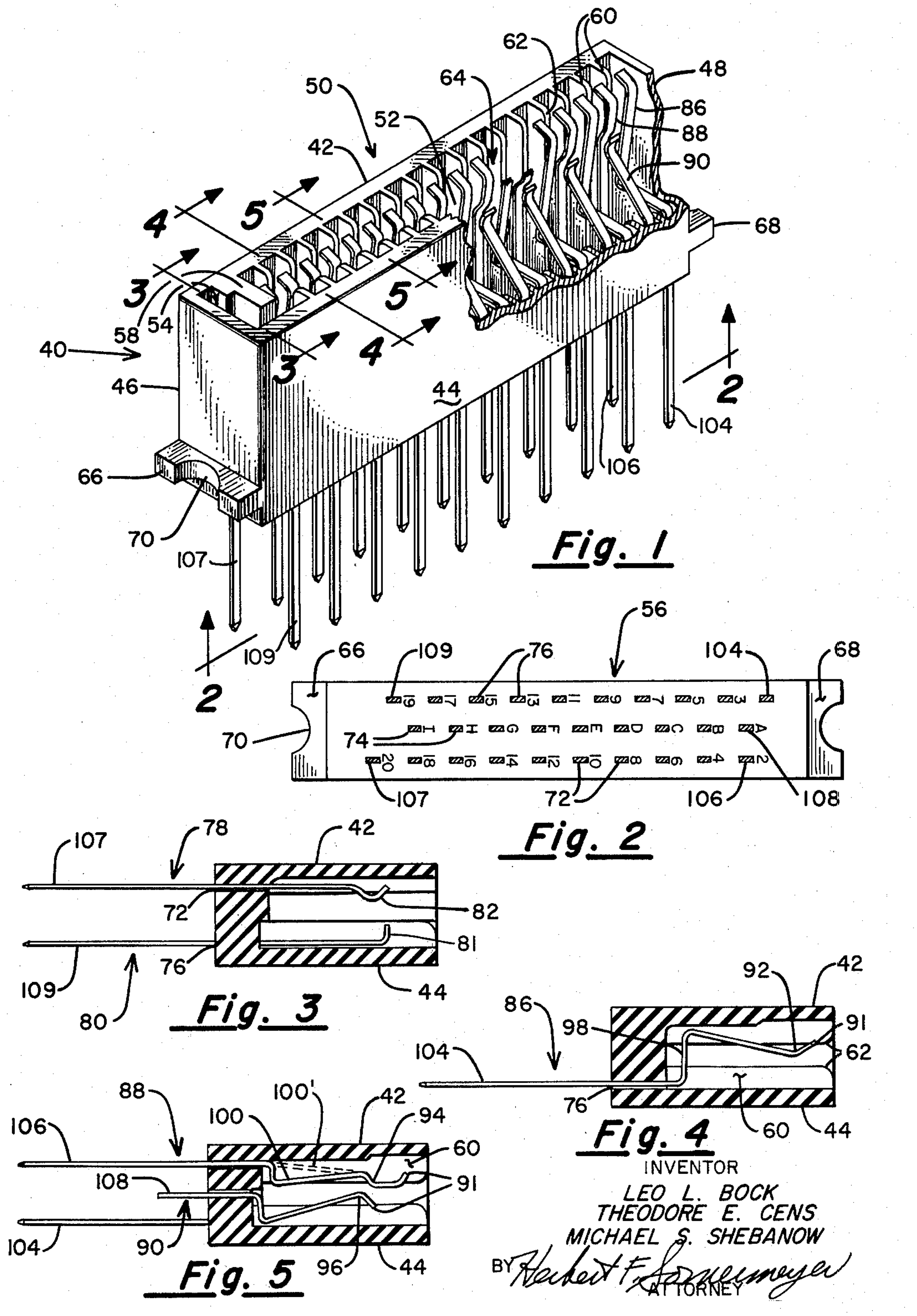
FIG. 2 is a bottom plan view of the receptacle of FIG. 1 taken substantially along the line 2—2 of FIG. 1.
FIG. 3 is a sectional view taken substantially along the line 3—3 of FIG. 1.
FIG. 4 is a sectional view taken substantially along the line 4—4 of FIG. 1.
FIG. 5 is a sectional view taken substantially along the line 5—5 of FIG. 1.

Referring now to FIGS. 1, 1*a*, and 2 there is seen a single receptacle 40 having a rectangular box-like insulating housing made of a material such as plastic. The housing includes the two opposing and parallel side walls 42 and 44 joined by the opposing walls 46 and 48 and by bottom 56, the bottom being best seen in FIG. 2. The receptacle 40 has one open side appearing as an elongated slot 50, which is divided into portions 52 and 54 termed card-receiving and card guide cavities respectively, by the integral stepped shoulder projection 58 extending from side wall 42.

In the card-receiving cavity 52 are several inwardly-extending laterally-spaced projections or ribs 60, one-half of which are on each side wall, the ribs on one side wall being respectively opposite the ribs on the other side wall. The projections 60 are located in substantially parallel relationship, extending from the bottom 56 and having rounded surfaces 62, which facilitate the insertion of a printed circuit card into the cavity 52.

The ribs 60 form the several recesses 64, which receive the contact members 86, 88 and 90, and are arranged in two opposing rows. The recesses have similar dimensions and are located in the first portion 52 of the elongated slot 50.

Disposed on the outer side of each end wall 46 and 48 and integral therewith are projecting lugs or hold-down means 66 and 68, each lug having a semi-circular indentation 70 for receiving a screw or other fastening means (not shown) to secure the receptacle in a desired position to a supporting frame or the like in the usual manner. The bottom wall 56 (FIG. 2) has formed therein three rows of several rectangular apertures 72, 74 and 76, which extend therethrough. These apertures receive and hold the contact members as will become apparent. The apertures 72 of the one outer row are spaced to open within the cavity 52 at the base of alternate recesses 64 along the one side wall 42 while the apertures 76 of the other outer row are spaced to open within the cavity 52 at the base of alternate recesses 64 along the other side wall 44 opposite the non-apertured recesses along the side wall 42. The center row of apertures 74 are laterally aligned with apertures 72 and 76 and located approximately midway between the outer rows. The apertures 72, 74 and 76 appearing in bottom wall 56 may be numerically or alphabetically indexed as indicated. A more comprehensive discussion of the spaced arrangement and indexing of these apertures will appear subsequently.

Supported in the receptacle housing are several types of metallic contact members, these being termed the bottom-contact members 86, top-contact members 88, center-contact members 90, retaining tie-point member 78, and lug tie-point member 80 (FIG. 3). These members may be constructed in the form of continuous, Phosphor bronze strips with a rectangular cross section. In certain applications, for improving the corrosion resistance and for lowering the electrical contact resistance of the members, they may be coated with a layer of a selected metal by electroplating or some other suitable method. The assembly of contact and tie-point members within the receptacle 40 may be accomplished manually, the members being inserted into the receptacle from the open side 50. The terminal portions 104, 106 and 108 respectively (FIGS. 4 and 5) of the members 86, 88 and 90 are inserted through certain rows of the apertures 72, 74 and 76 a short distance, such that at least the tips thereof extend through bottom wall 56. The terminal 107 of tie-point member 78 is located in one of the apertures 72 and the terminal 109 of tie-point member 80 is located in one of the apertures 76. A tool (not shown) is then used to grasp and pull the terminal portions further through the apertures for positioning the terminal tips a predetermined distance from the bottom wall 56. Each contact member and tie-point member is frictionally secured in a desired position within the housing by its terminal portion, the sides of which frictionally engage the walls of the aperture in which it is located. To increase the force of the frictional engagement, the terminal portions may be flared, or their dimensions may be otherwise increased or distorted in the area engaging the aperture walls.

Located within the card guide receiving cavity 54 are the retaining tie-point member 78 and the lug tie-point member 80 (best shown in FIG. 3). The retaining tie-point member 78 has an inwardly directed arcuate end portion 82 which operates as a releasable card guide locking means in a manner explained hereinafter. The lug tie-point member has one end portion 81 bent at approximately a right angle. It is the purpose of this right-angle bend to aid in orienting the tie-point member 80 during the assembly of the connector. The terminals 107 and 109 of the retaining and lug tie-point members 78 and 80 respectively are used as insulated tie points in the interconnection of receptacles. Note that these members do not engage the printed circuit card and therefore permit full usage of contact areas on all cards for interconnection purposes. The use of separate members in the receptacle for tie-points eliminates the need for providing tie-points separate from the receptacle. For example, a contact member of a receptacle may have a wire strung from its terminal portion to a lug tie-point terminal located within the same receptacle and a contact member of a second receptacle may have a wire connected to its terminal portion and to a lug tie-point terminal in the receptacle, the two contact members being interconnected by a wire connecting both tie-point terminals. This convenient method of interconnecting contact members of separate receptacles facilitates the assembly or disassembly of associated receptacles in that it can be used to minimize the number of wires on a particular terminal portion of a card contacting member.

The bottom and top contacts 86 and 88 appear alternately in recesses 64 along the side wall 42 of the receptacle 40 while the center contacts 90 are disposed in alternate recesses 64 along the side wall 44 opposite the contacts 88. The contacts 86 are disposed opposite those recesses 64 along the side wall 44 that do not contain a contact member.

Referring now to FIGS. 4 and 5 there is best shown the geometric configurations of the last-mentioned contact members. The inwardly extending portions 92 and 94 of members 86 and 88 respectively form a first row of resilient contacting portions and the inwardly extending portions 96 of center contact 90 form a second row of resilient contacting portions. These two rows of contacting portions are located in spaced-apart substantially parallel planes, and protrude within the receptacle beyond the edges of projections 60. From FIG. 1 it can be seen that together there are twice as many contact members 86 and 88 near one side of the receptacle housing wall 42 as there are contact members 90 near the wall 44. It is the purpose of these resilient portions to electrically contact the circuit terminal tabs disposed on a printed circuit card (such as is shown in FIG. 6 and generally designated at 110). The tips 91 of each contact member are turned back such that the tip falls within the respective recess 64 to avoid catching the card 110 on the edge of a contact member when the card is inserted into the cavity 52.

The contact members 86, 88 and 90 have offset portions 98, 100 and 102 respectively which extend across the bottom wall 56 of the receptacle 40 in a direction substantially perpendicular to the side walls 42 and 44, and parallel to end walls 46 and 48 of the receptacle. These offset portions align the terminal portions 104, 106 and 108 with their respective apertures 76, 72 and 74 in the bottom wall 56 for developing a minimal spaced arrangement of terminal portions into three substantially parallel rows. Illustrated by the dotted lines of FIG. 5 is an alternative embodiment 100' of the offset portion 100.

FIG. 5 further illustrates that the terminal portions 108 of the center contact members 90 are approximately one-third the length of the terminal portions 104 and 106 of members 86 and 88 respectively. The terminal portions 106 and 104 are of sufficient length to easily accommodate a number of turns of wire and may be generally referred to as wire-wrap terminals. The terminal portion 108 is not a wire-wrap terminal but is of sufficient length to accommodate conventional wiring attachment techniques, such as soldering. Thus it is seen that there are provided two connecting levels, one being adapted for wire-wrapping processes and the other being adapted for more conventional wiring methods.

Referring again to FIG. 2 wherein the terminals 104, 106, 108, 107 and 109 of the contact members 86, 88 and 90, and tie-point members 78 and 80 respectively are shown disposed in their appropriate apertures, it can be seen that the indexing means is effective to identify the terminals of the members. Since each terminal portion has a unique identification as a result of the numbering and lettering system, it can be seen that the terminal location in the receptacle can be identified quite readily. The terminal portions 106 of contacts 88 and the terminal portion 107 of the retaining tie-point 78 form one horizontal outer row of terminals, these being indexed by even numbers only. The terminal portions 104 of contacts 86 and the terminal portion 109 of the lug tie-point 80 form a second outer row of terminals, these being indexed by odd numbers only. The terminal portions 108 of contacts 90 form a central row of terminals, disposed approximately transversely centrally with respect to the outer terminals and identified by an alphabetical sequence. Terminal portions 106 and 108 are transversely aligned with respect to the rows. Terminal portions located in the outer rows are offset or staggered with respect to one another for providing a minimized spacial arrangement suitable for accommodating automatic wire-wrapping processes. The centrally located terminal portions 108 are shorter than the outer wire-wrap terminals such that they do not interfere with the wire wrapping of the outer row terminals.

It is to be noted that the terminal portions as seen in FIG. 2 are located at certain of the intersections of lines forming a one-eighth inch grid. The uniform distribution of the terminal portions effected by the grid pattern location of such terminal portions, accompanied by the shorter length of the centrally located terminal portions, enables the utilization of an enlarged number of contact members per square inch of receptacle area. Increased contact density, of course, allows a more effective and comprehensive use of printed circuit cards.

Referring to FIG. 6, there are shown two eight-unit receptacle assemblies 41 and 41'. A plurality of receptacles 40 is integrated to form the assembly 41. Alternatively, the assembly 41 may be embodied having the unitary insulating structure exhibited by the assembly 41'. Each of the units of the assemblies 41 and 41' receives a printed circuit card exemplified at 110. The card 110 used with the preferred embodiment of this invention possesses generally a rectangular shape and has conductive strips 117 disposed on both sides (only one side of the card being shown, however). The strips 117 on one side of the card terminate in terminal tabs 119, whereas the conductive strips on the opposite side of the card terminate in eighteen terminal tabs (not shown). The card circuitry generally includes circuit elements suc as resistors 121, transistors 123 and capacitors 125. The illustrated circuitry, including the elements, is exemplary only. It will be understood by those skilled in the art that the edge or terminal end 111 of the printed circuit card 110 corresponds in length with the previously discussed cavity 52, so that the edge of the card fits within the cavity, the terminal tabs being properly positioned to make desired electrical connections along the rows of the contact members.

To aid in the insertion and retention of printed circuit cards within a receptacle or group of receptacles, a card guide apparatus 112 is employed in a manner to be hereinafter explained. The guide 112 is preferably a unitary structure made of an insulating material, such as a plastic, and has a plurality of substantially parallel elongated legs or upstanding members 114. It is to be understood that the card guide may be manufactured with as many legs as is desirable for a particular receptacle assembly. Disposed on opposite sides of each leg member 114 are guide means or card receiving channels 116. The paired channels 116 on each of the legs 114 are utilized when receptacle assemblies are mounted in side-by-side relationship. As is seen in FIG. 6 and FIG. 6*a*, the assemblies 41 and 41', secured in adjacent relationship by the clamping means 43, retain the card guides 112 and 112' respectively in spaced relationship for co-operating in the insertion and retention of card 110 in the assembly 41. Thus the edge 118 of the card 110 is embraced by the channel 116 in the card guide 112 while the opposite edge 120 is received by a channel 116' (the specific receiving channel being on the opposite side of the one identified on the drawing and therefore not seen in card guide 112'). This arrangement of co-operating card guides effects a substantial space saving while providing support for both edges of a printed circuit card.

When a given assembly is located as the last assembly of a composite or series of assemblies, such as the assembly 41', it is generally desirable to introduce an additional member for retaining a card guide, for example, retainer assembly 45. It is the purpose of the retainer assembly 45 to provide support for a card guide 112'' which co-operates with a next adjacent card guide 112' for appropriately guiding and aligning a printed circuit card (not shown) during insertion into assembly 41'. The retainer 45 which is secured adjacent assembly 41' by clamping means 43', is comprised of an insulating housing 49 adapted to receive card guide 112'' and is essentially identical in construction to that portion of assembly 41 which receives card guide 112, that is, it is equivalent to the cavities 54.

An enlarged illustration of the card guide 112 is shown in FIG. 7. Extending into the channels 116 which are disposed on both sides of the leg members 114 are small, semi-circular extensions 122 for reducing the space between the channel walls 124 and 126 to minimize or eliminate vibration-caused motion of an inserted card. The opposing channels 116 are formed by the side walls 124 and 126, and separated by a bottom 128 (best shown in FIG. 8). The channel walls diverge in the area of a transverse web 130 which extends across the guide 112 and is effective to associate and equidistantly space the legs 114. The diverging walls of the channel 116 result in an enlargement thereof for facilitating the insertion of a printed circuit card into the channels of the card guide.

Extending perpendicularly from the web and integrally associated therewith is an upper extension 132 having a locking lug 134 which, with a peripheral notch 138 (FIG. 6) in a printed circuit card, forms a detent means for releasably locking the printed circuit card in the receptacle. As the card is inserted into the cavity 52, the lug 134 rides along the surface of the card 110 near its edge. The notch 138 receives the lug when the card is inserted to a proper depth, and locks the card within the receptacle. The notch 140 located on the opposite side of the card accommodates a locking lug 134′ associated with a similar card guide 112′ secured in the next adjacent recepetcle asembly 41′.

Thus the card 110 is firmly secured within the card-receiving cavity 52 by the combined bearing force of the plurality of resilient portions of contact members supported within the receptacle and by the reception of locking lugs 134 and 134′ in the card notches 138 and 140. This combination of restraining and locking features substantially precludes loosening of the card 110 within the receptacle by vibration or shock.

The lowermost portion or shoe 142 of the legs 114 is inserted into the previously discussed card guide receiving cavities 54 which are aligned in the eight-unit receptacle assembly 41. After insertion, the recess 144 in the shoe 142 is lockingly engaged by the arcuate portion 82 of tie-point 78, to retain the card guide apparatus 112 in the receptacle assembly. By causing this locking engagement to occur within the receptacle, a more compact arrangement is achieved with a desirable space saving resulting. Further the member 78 is effective to bias the flat edge 146 (FIG. 9), of shoe 142 against the side wall 44, the force exerted by the member 78 on the shoe 142 maintaining the card guide 112 in substantially perpendicular relationship to the assembly 41. The provision of the member 78 for not only internally locking the card guide 112 in position but also for co-operating with the remainder of the contact members as an electrical tie-point effects an increased contact density.

Referring now to FIG. 9 there is seen a centrally located elevated area 148 appearing on one side of the shoe 142. This elevated area 148 reduces the play or looseness of fit of the shoe in the card guide receiving cavity 54, thus assuring the secure fit of the shoe in the card guide-receiving cavity. Also integrally associated with the shoe 142 is a ball portion or rounded extension 150 which extends from the shoe 142 and provides a degree of stabilization of the card guide apparatus 112 after the shoe 142 has been inserted into the card guide-receiving cavity, the ball 150 fitting into the space between the shoulder projection 58 and side wall 44 and immediately above the tie-point member 80. The ball 150 limits the amount of back-and-forth motion which may be imparted to the card guide apparatus after its insertion into an assembly and also prevents the incorrect insertion of the card guide into the receptacle assembly 41. The striking of the ball 150 against stepped shoulder projection 58 limits movement of the card guide after correct insertion of the shoe 142 into the cavity 54. If an attempt were made to insert the card guide incorrectly, the ball 150 would strike the upper portion of end wall 46 and thus prevent the complete insertion of the guide into the receptacle.

FIGS. 10 and 11 in conjunction with FIG. 7 illustrate end views of the guide 112 whereon there is seen on opposite ends a single extension 152 and paired extensions 154 and 156. As is shown in FIG. 10, the extension 152 is substantially centrally located with respect to the edges of the channel defining wall 126. In FIG. 11 it is seen that extensions 154 and 156, the former being above the latter, are spaced apart such that a slot 158 is formed therebetween. It is the purpose of the aforementioned extensions to form an interlocking means for coplanar adjacent card guides. Thus the member 152 of one card guide apparatus is, during assembly, fitted in the slot 158 between members 154 and 156 of the next adjacent card guide apparatus. This interlocking means precludes extensive horizontal movement of the upper portion of the card guide apparatus.

It is understood that suitable modifications may be made in the structure as disclosed provided such modifications come within the spirit and scope of the appended claims. Having now, therefore, fully illustrated and described our invention, what we claim to be new and desired to protect by Letters Patent is:

1. In an electrical receptacle adapted for receiving a printed circuit card having a plurality of spaced terminal tabs arranged along one edge thereof, the receptacle comprisign: an insulating housing having an opening therein adapted to receive the edge and being defined by spaced side walls joined by end and bottom walls, the bottom wall having a plurality of apertures therein; a plurality of contact members, each of the contact members having a terminal portion an a resilient contact portion, the resilient contact portions being disposed within the opening and arranged in first and second substantially parallel spaced-apart rows, there being one resilient contact portion in the first row and two resilient contact portions in the second row, the resilient contact portion of the first row being aligned with one resilient contact portion of the second row in a plane substantially perpendicular to the direction of the rows; means for extending the terminal portions through the respective apertures for locating the terminal portions in first, second and third substantially parallel planes, the terminal portions located in the first and second planes being aligned in a direction that is substantially perpendicular to the direction of the planes, the terminal portion located in the third plane being offset in the direction of the planes with respect to the other terminal portions.

2. Apparatus as in claim 1 wherein the length of the terminal portion located in the second plane is less than the length of terminal portions located in the first and third planes.

3. An electrical receptacle for printed circuit cards having a plurality of spaced terminal tabs arranged along one edge thereof, the receptacle comprising: an elongated insulating housing having an opening defined by spaced side walls joined by end and bottom walls, the bottom wall having a plurality of apertures therein; a plurality of contact members supported by the housing, the contact members each comprising a resilient portion, an offset portion, and a terminal portion extending through one of the apertures, the terminal portions being disposed outside of the housing and being arranged in three substantially parallel rows, the terminal portions located in the first and second rows being aligned in a direction that is substantially perpendicular to the direction of the rows, the terminal portion located in the third row being offset with respect to the other terminal portion the resilient portions being arranged in two spaced opposing rows to receive and engage the terminal tabs of an inserted card, and the offset portions extending parallel to the end walls and along the bottom wall for extending the terminal portions through selected apertures.

4. An electrical receptacle for printed circuit cards having a plurality of spaced terminal tabs arranged along one edge thereof, the receptacle comprising: an insulating housing having an opening therein adapted to receive the edge and being partially defined by spaced side walls joined by end walls; a plurality of contact members, each of the contact members having a terminal portion and a resilient contact portion, the resilient contact portions being disposed within the opening and arranged in first and second substantially parallel spaced-apart rows, there being at least one resilient contact portion in the first row and at least two resilient contact portions in the second row, the resilient contact portion of the first row being aligned with one resilient contact portion of the second row in a plane substantially perpendicular to the direction of the rows; a bottom wall closing one side of the opening and having a plurality of apertures therein, the apertures being located in first, second and third substantially parallel planes, the apertures located in the first and second planes being aligned in a direction that is substantially perpendicular to the direction of the planes; means for extending the terminal portions through selected ones of the apertures, the aperture located in the first plane receiving the terminal portion of the contact member having its resilient contact portion in the second row, the aperture located in the second plane receiving the terminal portion of the contact member having its resilient contact portion in the first row, and the aperture located in the third plane receiving the terminal portion of the other contact member having its resilient contact portion in the second row.

5. An electrical receptacle for printed circuit cards having a plurality of spaced terminal tabs arranged along one edge thereof, the receptacle comprising: an insulating housing having an opening defined by spaced side walls joined by end and bottom walls, the bottom wall having apertures therein; a plurality of contact members and non-terminal tab engaging tie-point members associated with the housing, each of the members having a terminal portion, the terminal portions of the tie-point members being electrically conductive and extending through selected ones of the apertures, the contact members each having a resilient contact portion, the resilient portions being disposed in the opening and arranged in first and second substantially parallel spaced-apart rows, the resilient contact portions of the first row being aligned with alternate resilient contact portions of the second row in a direction that is perpendicular to the direction of the rows; means for allowing the terminal portions of the contact members to extend through selected ones of the apertures in the bottom walls, the terminal portions of the contact members being arranged in three substantially parallel planes, the terminal portions located in the first and second planes being aligned in a direction that is substantially perpendicular to the direction of the planes, the terminal portions located in the third plane being offset with respect to the other terminal portions, and the terminal portions of the tie-point members being located in the first and third parallel planes.

6. Apparatus as in claim 5 being particularly characterized in that the terminal portions located in the second plane are shorter than the terminal portions extending through apertures located in the first and third planes.

7. An electrical receptacle for printed circuit cards having a plurality of spaced terminal tabs arranged along one edge thereof, the receptacle comprising: an insulating housing having an elongated opening defined by spaced side walls joined by end walls and a bottom, the bottom having a plurality of apertures therein; a plurality of contact members supported by the housing, the contact members each having a resilient portion, an offset portion, and a terminal portion, the resilient portions being arranged within the opening in two spaced opposing rows to receive and engage the terminal tabs of an inserted printed circuit card, the offset portions extending along the bottom wall for extending the terminal portions through selected ones of the apertures, the terminal portions being located outside of the housing in three substantially parallel equidistantly spaced planes, the first and third planes being outer planes, the terminal portions located in the first and third planes being equally spaced from one another in the direction of the planes, and being offset with respect to one another, the spacing of the terminal portions located in the first and third planes being adequate for accommodating automatic wire-wrapping heads, the terminal portions located in the second plane being shorter than the terminal portions located in the first and third planes and being aligned with the terminal portions of the first plane in a direction perpendicular to the direction of the planes, and each of the terminal portions being located at certain ones of the intersections of lines forming a one-eighth inch grid for compactly arranging two electrical connecting levels.

8. Apparatus as in claim 7 and further including a non-terminal tab engaging tie-point member supported by the housing and having an electrically conductive terminal portion extending through one of the apertures, and being located in one of the outer planes.

9. An electrical receptacle for printed circuit cards having a plurality of spaced terminal tabs arranged along one edge thereof, the receptacle comprising: an insulating housing having an elongated opening defined by spaced side walls joined by end and bottom walls, the opening being effectively divided into first and second portions; opposed surfaces of the side walls having laterally spaced ribs and intermediate recesses, the ribs extending inwardly into the first portion, the ribs of one side wall being spaced from the ribs of the opposed side wall; a plurality of contact members disposed in the first portion being arranged alternately in recesses adjacent one side wall and successively in recesses adjacent the opposite side wall, the contacts having resilient portions for resiliently engaging the spaced terminal tabs; a plurality of non-terminal tab engaging tie-point members having electrically conductive terminal portions and being disposed in the second portion of the elongated opening; three substantially parallel rows of rectangular apertures opening through the bottom wall of the housing, the apertures forming the outer two of the rows being staggered spacially and a plurality of the apertures being in alignment with alternate ones of the opposing stresses, the center row of the apertures being located midway between the outer rows, the apertures of the center row being aligned with apertures of one of the outer rows in a direction that is substantially perpendicular to the direction of the rows; and a terminal portion of the contact members, and tie-point members extending through selected ones of the apertures.

10. Apparatus as in claim 9 wherein the terminal portions of the tie-point members extend through the apertures forming the outer rows.

11. Apparatus as in claim 10 wherein the terminal portions of the tie-point members are located in the outer rows in equal numbers.

12. Apparatus as in claim 10 wherein the outer rows of the terminal portions form a first connecting level and the center row of the terminal portions form a second connecting level.

13. Apparatus for receiving and retaining a printed circuit card comprising in combination: a card receiving receptacle and a card guide; the receptacle comprising an insulating housing having an elongated opening defined by spaced side walls joined by end walls and a bottom having a plurality of apertures therein, the opening being effectively divided into first and second portions; a plurality of contact members supported by the housing, the contact members each comprising a contact resilient portion, a contact offset portion and a contact terminal portion, the contact resilient portions being disposed in the first portion of the opening and arranged for forming two spaced-apart rows for resiliently engaging the printed circuit card upon its insertion therebetween, the contact offset portions extending substantially parallel to the end walls and along the bottom wall for extending the contact terminal portions into selected ones of the apertures, the contact terminal portions being arranged in three substantially parallel planes outside of the housing; a plurality of non-terminal tab engaging tie-point members supported by the housing and having electrically conductive tie-point terminal portions extending through selected ones of the apertures, and at least one of the tie-point members having a resilient arcuate portion disposed in the second portion of the opening; the card guide including an elongated leg member having a guide means disposed along one side thereof for slidably receiving and guiding a card into the first portion of the opening, the elongated leg member having a base portion with a recess therein for lockingly receiving the resilient arcuate portion of the tie-point member upon the insertion of the base portion into the second portion of the opening.

14. An electrical receptacle for printed circuit cards having a plurality of spaced terminal tabs arranged along one edge thereof, the receptacle comprising:

(A) an elongated insulating housing having an opening for receiving the one edge, the opening being defined by spaced side walls joined by end and bottom walls, the bottom wall having a plurality of apertures therein;

(B) a plurality of contact members supported by the housing, (a) the contact members each comprising a resilient terminal tab-engaging portion and a terminal portion extending through one of the apertures, (b) the terminal tab-engaging portions being disposed in the opening and arranged to electrically engage the circuit card spaced terminal tabs upon the insertion of the card, and (c) the contact member terminal portions being disposed outside of the housing and being arranged in three substantially parallel rows, (d) the tab-engaging portion of alternate contact members disposed along one side wall of said receptacle having a terminal portion emerging from said bottom wall along one side thereof, (e) and the remaining tabs disposed along said same side wall containing a portion extending parallel to said bottom wall and having a terminal portion emerging from said bottom wall along another side thereof.

15. The invention defined in claim 14 wherein the terminal tab-engaging portions of all said contact members in said housing are arranged in two spaced-apart rows.

16. An electrical receptacle for printed circuit cards having a plurality of spaced terminal tabs arranged along one edge thereof, the receptacle comprising:

(A) an elongated insulating housing having an opening for receiving the one edge, the opening being defined by spaced side walls joined by end and bottom walls, the bottom wall having a plurality of apertures therein;

(B) a plurality of contact members supported by the housing, (a) the contact members each comprising a resilient terminal tab-engaging portion and a terminal portion extending through one of the apertures, (b) the terminal tab-engaging portions being disposed in the opening and arranged to electrically engage the circuit card spaced terminal tabs upon the insertion of the card, (c) the contact member terminal portions being disposed outside of the housing and being arranged in three substantially parallel rows, (C) at least one non-terminal tab-engaging tie-point member supported by the housing and having an electrically conductive terminal portion extending through one of the apertures, the tie-point member terminal portion being disposed outside of the housing and being arranged in one of the parallel rows.

17. An electrical receptacle for printed circuit cards having a plurality of spaced terminal tabs arranged along one edge thereof, the receptacle comprising:

(A) an elongated insulating housing having an opening for receiving the one edge, the opening being defined by spaced side walls joined by end and bottom walls, the bottom wall having a plurality of apertures therein;

(B) a plurality of contact members supported by the housing, (a) the contact members each comprising a resilient terminal tab-engaging portion and a terminal portion extending through one of the apertures, (b) the terminal tab engaging portions being disposed in the opening and arranged to electrically engage the circuit card spaced terminal tabs upon the insertion of the card, (c) the contact member terminal portions being disposed outside of the housing and arranged in three substantially parallel rows, (C) a plurality of non-terminal tab engaging tie-point members supported by the housing, each of the tie-point members having an electrically conductive terminal portion extending through one of the apertures, the tie-point member terminal portions being disposed outside of the housing and being arranged in equal numbers in only two of the parallel rows.

18. Apparatus for receiving and retaining a printed circuit card having a plurality of spaced terminal tabs arranged along one edge thereof, the apparatus including in combination:

(A) a card receiving receptacle comprising, (B) an elongated insulating housing having an opening for receiving the one edge, the opening being defined by spaced side walls joined by end and bottom walls, the bottom wall having a plurality of apertures therein, (C) a plurality of contact members supported by the housing, (a) the contact members each comprising a resilient terminal tab engaging portion and a terminal portion extending through one of the apertures, (b) the terminal tab engaging portions being disposed in the opening and arranged to electrically engage the circuit card spaced terminal tabs upon the insertion of the card, (c) the contact member terminal portions being disposed outside of the housing and being arranged in three substantially parallel rows;

(D) at least one non-terminal tab engaging tie-point member supported by the housing, (a) the tie-point member comprising a resilient arcuate portion disposed in the opening and an electrically conductive terminal portion extending through one of the apertures, the tie-point member terminal portion being disposed outside of the housing and being arranged in one of the parallel rows, (E) a card guide comprising, (F) an elongated leg member having a guide means disposed along one side thereof for slidably receiving and guiding the circuit card into the opening, the elongated leg member having a base portion with a recess therein for lockingly receiving the resilient arcuate portions of the tie-point member upon the insertion of the base portion into the opening.

References Cited by the Examiner

UNITED STATES PATENTS

| | | | |
|---|---|---|---|
| 2,543,000 | 2/51 | Deakin | 339—192 X |
| 2,649,558 | 8/53 | Franz | 339—275 |

(Other references on following page)

UNITED STATES PATENTS

| | | | |
|---|---|---|---|
| 2,825,037 | 2/58 | French | 339—17 |
| 2,882,511 | 4/59 | Mason | 339—176 |
| 2,946,033 | 7/60 | Wirth | 339—17 |
| 3,008,113 | 11/61 | Johnson | 339—17 |
| 3,015,797 | 1/62 | Mitchell et al. | 339—17 |

OTHER REFERENCES

Continental "Electronic Equipment," April 1956, page 33.

JOSEPH D. SEERS, *Primary Examiner.*

UNITED STATES PATENT OFFICE
CERTIFICATE OF CORRECTION

Patent No. 3,193,791 July 6, 196

Leo L. Bock et al.

It is hereby certified that error appears in the above numbered patent requiring correction and that the said Letters Patent should read as corrected below.

Column 6, line 18, for "suc" read -- such --; column 7, line 21, for "recepetcle" read -- receptacle --; column 8, line 20 and 21, for"comprisign" read -- comprising --; line 62, for "portion" read -- portions, --; column 10, line 38, for "stresses" read -- recesses --.

Signed and sealed this 22nd day of February 1966.

(SEAL)
Attest:

ERNEST W. SWIDER
Attesting Officer

EDWARD J. BRENNER
Commissioner of Patents